(12) United States Patent
Wang et al.

(10) Patent No.: US 11,805,692 B2
(45) Date of Patent: Oct. 31, 2023

(54) ELECTROLUMINESCENT DISPLAY PANEL, DISPLAY APPARATUS AND IMAGE ACQUISITION METHOD

(71) Applicant: BOE Technology Group Co., Ltd., Beijing (CN)

(72) Inventors: Zifeng Wang, Beijing (CN); Yan Ren, Beijing (CN); Lei Cao, Beijing (CN); Junmin Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 103 days.

(21) Appl. No.: 16/905,932

(22) Filed: Jun. 19, 2020

(65) Prior Publication Data

US 2021/0043696 A1 Feb. 11, 2021

(30) Foreign Application Priority Data

Aug. 5, 2019 (CN) .......................... 201910718725.7

(51) Int. Cl.
*H10K 59/50* (2023.01)
*H10K 59/35* (2023.01)

(52) U.S. Cl.
CPC ........... *H10K 59/353* (2023.02); *H10K 59/50* (2023.02)

(58) Field of Classification Search
CPC .............. G09G 3/3258; H01L 27/3213; H01L 27/3218; H01L 27/3232; H01L 27/3216; H10K 59/50; H10K 59/351–353
See application file for complete search history.

(56) References Cited

U.S. PATENT DOCUMENTS

| | | | |
|---|---|---|---|
| 2013/0154910 | A1 | 6/2013 | Chu et al. |
| 2017/0070679 | A1* | 3/2017 | Chung ................... H04N 23/50 |
| 2017/0194389 | A1 | 7/2017 | Guo et al. |
| 2018/0182825 | A1* | 6/2018 | Gu ........................ H01L 51/56 |
| 2018/0240851 | A1* | 8/2018 | Liu ........................ H01L 51/56 |
| 2018/0286335 | A1* | 10/2018 | Zhu .......................... G02F 1/15 |
| 2019/0373166 | A1* | 12/2019 | Jia ........................ G09G 3/2003 |
| 2019/0393286 | A1 | 12/2019 | Ding et al. |

(Continued)

FOREIGN PATENT DOCUMENTS

| | | |
|---|---|---|
| CN | 102623462 A | 8/2012 |
| CN | 104916661 A | 9/2015 |
| CN | 207264695 U | 4/2018 |

(Continued)

OTHER PUBLICATIONS

Office Action dated Mar. 11, 2021 for Chinese Patent Application No. 201910718725.7 and English Translation.

(Continued)

*Primary Examiner* — Eric K Ashbahian
(74) *Attorney, Agent, or Firm* — Ling Wu; Stephen Yang; Ling and Yang Intellectual Property

(57) ABSTRACT

Provided is an electroluminescent display panel, including: a first region and a second region. The first region includes a plurality of first pixels each including a plurality of first type subpixels and at least one second type subpixel. The second region includes a plurality of second pixels each including a plurality of first type subpixels. The second type subpixel is configured to be light-transmitting and non-light-transmitting in an image acquisition state and in an image display state, respectively.

12 Claims, 4 Drawing Sheets

(56) References Cited

U.S. PATENT DOCUMENTS

| | | | | |
|---|---|---|---|---|
| 2021/0135151 A1* | 5/2021 | Baek | ............ | H01L 51/5237 |
| 2021/0327979 A1* | 10/2021 | Kamada | ............ | G09F 9/30 |

FOREIGN PATENT DOCUMENTS

| | | | |
|---|---|---|---|
| CN | 108376696 A | 8/2018 |
| CN | 108666348 A | 10/2018 |
| CN | 109037302 A | 12/2018 |

OTHER PUBLICATIONS

Office Action dated May 27, 2021 for Chinese Patent Application No. 201910718725.7 and English Translation.

Haihong Wang et al., Handbook of Interpretation of Flat Panel Displays, pp. 1-6, Southeast University Press.

* cited by examiner

ELECTROLUMINESCENT DISPLAY PANEL, DISPLAY APPARATUS AND IMAGE ACQUISITION METHOD

CROSS-REFERENCE TO RELATED APPLICATION

This application claims the priority of Chinese Patent Application No. 201910718725.7 filed to CNIPA on Aug. 5, 2019, the content of which is hereby incorporated by reference.

TECHNICAL FIELD

The present disclosure relates to, but is not limited to, the field of display technology, in particular to an electroluminescent display panel, a display apparatus and an image acquisition method.

BACKGROUND

Flat Panel Displays (FPDs) have become mainstream products on the market. There are more and more types of FPDs, e.g., Liquid Crystal Displays (LCD), Organic Light Emitted Diode (OLED) displays, Plasma Display Panels (PDP), Field Emission Displays (FED).

With development of technologies, display screens used in display products are undergoing a transition to full display. For the current "bangs" display, dot display, pole display, etc., a place is particularly designated directly above a display screen for placing a camera. Since the camera will occupy a place on the front of the display screen, the display screen cannot really achieve full display.

SUMMARY

The following is a summary of the subject matter described in detail herein. This summary is not intended to limit the scope of protection of the claims.

The present disclosure provides an electroluminescent display panel, a display apparatus, and an image acquisition method.

An embodiment of the present disclosure provides an electroluminescent display panel, including: a first region and a second region. The first region includes a plurality of first pixels each including a plurality of first type subpixels and at least one second type subpixel. The second region includes a plurality of second pixels each including a plurality of first type subpixels. The second type subpixel is configured to be light-transmitting and non-light-transmitting in an image acquisition state and in an image display state, respectively.

In a possible embodiment, the second type subpixel may include: a first electrode and a second electrode which are light-transmitting and are oppositely arranged, and an ion conductive layer, an electrochromic layer, and an ion storage layer which are sequentially stacked between the first electrode and the second electrode.

In a possible embodiment, a first pixel may include three first type subpixels of different colors and one second type subpixel; and a second pixel may include four first type subpixels of different colors.

In a possible embodiment, subpixels in the first pixel and the second pixel may all have a "田"-shaped distribution.

In a possible embodiment, the first region may include a plurality of first sub-regions, arrangement positions of second type subpixels in first pixels in the same first sub-region may be the same, and arrangement positions of second type subpixels in first pixels in different first sub-regions may be different from each other.

In a possible embodiment, arrangement of the plurality of first sub-regions may be the same as arrangement of subpixels in the first pixel.

An embodiment of the present disclosure further provides a display apparatus, including an electroluminescent display panel and an image acquisition component located on a back surface of the electroluminescent display panel. The electroluminescent display panel includes: a first region and a second region, the first region including a plurality of first pixels each including a plurality of first type subpixels and at least one second type subpixel; and the second region including a plurality of second pixels each including a plurality of first type subpixels. The second type subpixel is configured to be light-transmitting and non-light-transmitting in an image acquisition state and in an image display state, respectively. The image acquisition component may be disposed corresponding to the first region and configured to acquire, during image acquisition, a plurality of images at different positions of the first region and combine the plurality of images into a complete target image.

In a possible embodiment, the first region may include a plurality of first sub-regions, arrangement positions of second type subpixels in first pixels in the same first sub-region may be the same, and arrangement positions of second type subpixels in first pixels in different first sub-regions may be different from each other. The image acquisition component may include: a plurality of sub-image acquisition units each provided corresponding to each of the first sub-regions, each of the sub-image acquisition units may be configured to acquire, during image acquisition, light passing through second type subpixels in a corresponding first sub-region.

In a possible embodiment, arrangement of the plurality of first sub-regions may be the same as arrangement of subpixels in the first pixel.

In a possible embodiment, the second type subpixel may include: a first electrode and a second electrode which are light-transmitting and are oppositely arranged, and an ion conductive layer, an electrochromic layer, and an ion storage layer which are sequentially stacked between the first electrode and the second electrode.

In a possible embodiment, a second pixel may include four first type subpixels of different colors; and a first pixel may include three first type subpixels of different colors and one second type subpixel.

In a possible embodiment, subpixels in the first pixel and the second pixel may all have a "田"-shaped distribution.

In a possible embodiment, the image acquisition component may be configured to move, during image acquisition, in the first region to acquire light passing through second type subpixels at different positions of a corresponding first region.

An embodiment of the present disclosure further provides an image acquisition method for a display apparatus. The display apparatus may include: an electroluminescent display panel and an image acquisition component located on a back surface of the electroluminescent display panel. The electroluminescent display panel may include a first region and a second region. The first region may include a plurality of first pixels, each of the first pixels may include a plurality of first type subpixels and at least one second type subpixel; and the second region may include a plurality of second pixels, each of the second pixels may include a plurality of first type subpixels. The image acquisition component may be disposed corresponding to the first region. The image acquisition method may include: controlling, during image acquisition, second type subpixels in the first region of the electroluminescent display panel to be in a light-transmitting state; and acquiring a plurality of images at different positions of the first region by the image acquisition component, and combining the plurality of images into a complete target image.

In a possible embodiment, the first region may include a plurality of first sub-regions, arrangement positions of second type subpixels in first pixels in the same first sub-region may be the same, and arrangement positions of second type subpixels in first pixels in different first sub-regions may be different from each other. The image acquisition component may include a plurality of sub-image acquisition units each provided corresponding to each of the first sub-regions. The acquiring a plurality of images at different positions of the first region by the image acquisition component may include: acquiring, by each of the sub-image acquisition units, light passing through second type subpixels in corresponding first sub-region.

In a possible embodiment, the acquiring a plurality of images at different positions of the first region by the image acquisition component may include: controlling the image acquisition component to move in the first region to acquire light passing through second type subpixels at different positions of a corresponding first region.

In a possible embodiment, the image acquisition method may further include: controlling, during image display, second type subpixels in the first region to be in a non-light-transmitting state.

In a possible embodiment, the second type subpixel may include: a first electrode and a second electrode which are light-transmitting and are oppositely arranged, and an ion conductive layer, an electrochromic layer, and an ion storage layer which are sequentially stacked between the first electrode and the second electrode.

In a possible embodiment, a first pixel may include three first type subpixels of different colors and one second type subpixel; and a second pixel may include four first type subpixels of different colors.

In a possible embodiment, subpixels in the first pixel and the second pixel may all have a "田"-shaped distribution.

Other aspects will become apparent upon reading and understanding the brief description of the drawings and the embodiments of the present disclosure.

DETAILED DESCRIPTION

In order to make objectives, technical solutions and advantages of the embodiments of the present disclosure more clear, the technical solutions of the embodiments of the present disclosure will be clearly and completely described below with reference to the drawings of the embodiments of the present disclosure. The described embodiments are some of the embodiments of the present disclosure, rather than all of the embodiments. Based on the described embodiments of the present disclosure, all other embodiments obtained by those of ordinary skills in the art without creative work are covered by the scope of protection of the present disclosure.

Unless otherwise defined, technical terms or scientific terms used in the present disclosure shall have common meanings as construed by those of ordinary skills in the art to which the present disclosure pertains. The wordings "first", "second" and the like used in the present disclosure do not represent any order, quantity or importance, but are merely used to distinguish among different components. Similar terms such as "include" or "contain" mean that an element or item appearing before the terms covers an element or item and its equivalents listed after the terms, without excluding other elements or items. Similar terms such as "connect" or "link" are not limited to physical or mechanical connections, but may include electrical connections, whether direct or indirect. "Up", "down", "left", "right", etc. are only used to represent a relative positional relationship that may change accordingly when an absolute position of an object being described changes.

In order to keep the following description of the embodiments of the present disclosure clear and concise, detailed descriptions of known functions and known components are omitted from the present disclosure.

Figure 1:
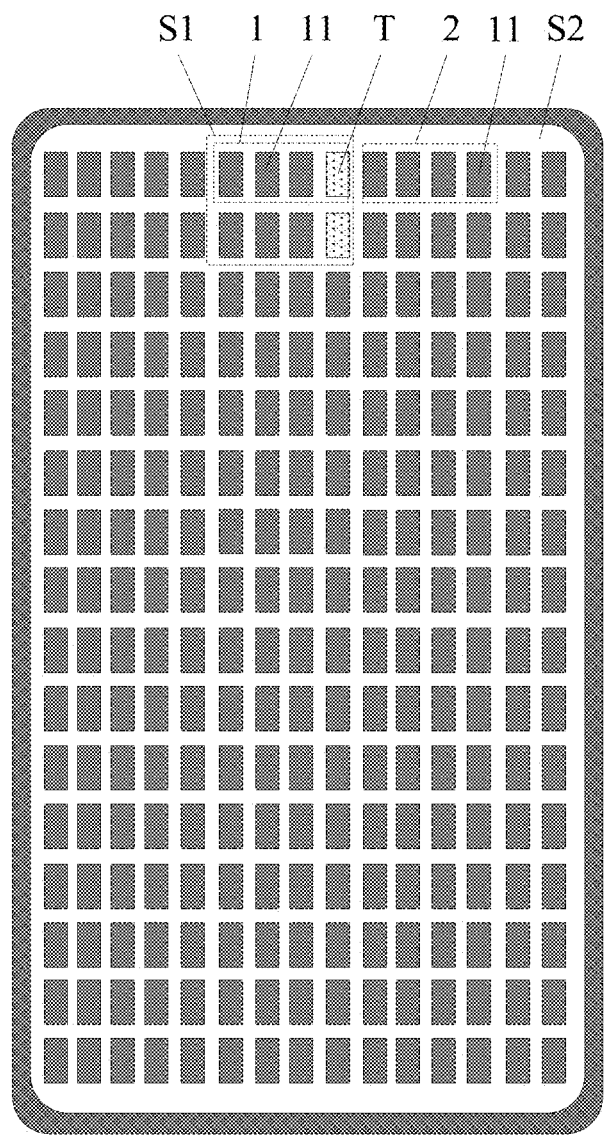
FIG. 1 is a schematic view of a structure of an electroluminescent display panel according to at least one embodiment of the present disclosure.

FIG. 1 is a schematic view of a structure of an electroluminescent display panel according to at least one embodiment of the present disclosure. Referring to FIG. 1, an electroluminescent display panel according to an embodiment of the present disclosure may include a first region S1 and a second region S2. The first region S1 may include a plurality of first pixels 1. Each of the first pixels 1 may include a plurality of first type subpixels 11 and at least one second type subpixel T. The second region S2 may include a plurality of second pixels 2. Each of the second pixels 2 may include a plurality of first type subpixels 11. The second type subpixel T may be configured to be light-transmitting and non-light-transmitting in an image acquisition state and in an image display state, respectively. In some examples, each of the second pixels may include only a plurality of first type subpixels. However, this is not limited in the present embodiment.

In the electroluminescent display panel according to an embodiment of the present disclosure, the first region S1 includes a plurality of first pixels 1, each of the first pixels 1 including a plurality of first type subpixels 11 and at least one second type subpixel T that is configured to be light-transmitting and non-light-transmitting in an image acquisition state and in an image display state, respectively. Then an image acquisition component may be disposed under the first region S1. When image acquisition is required, the second type subpixels T in the first region S1 are controlled to be in a light-transmitting state to provide the image acquisition component with an optical path, then the image acquisition component may perform image acquisition by light passing through the second type subpixels T, and combine and synthesize images formed by the light passing through the second type subpixels T at different positions in the first region S1 to form a complete target image. When image display is required, the second type subpixels T may be in a non-light-transmitting state and cooperate with other first type subpixels 11 in the first region S1 to realize color display in the first region S1, and can enable, in combination with the second pixels 2 in the second region S2, the electroluminescent display panel to present full-screen display, thereby realizing switching between image acquisition and full-screen display.

FIG. 1 is merely an illustration with the first region S1 including two first pixels 1. In some example embodiments, the first region S1 may include more first pixels 1, and the embodiments of the present disclosure are not limited to this.

In some example embodiments, the first region S1 may be an image acquisition region, and the second region S2 may be a region other than the first region S1. The first type subpixel 11 may be a primary color subpixel, for example, may be a red subpixel R, a green subpixel G, or a blue subpixel B. During image acquisition, the first type subpixels 11 in the first region S1 may be in a dark state. In some examples, during image display, the first type subpixels 11 may be normally displayed, and the second type subpixels T are non-transparent, i.e., in a non-light-transmitting state, in which the image acquisition component under the first region S1 cannot acquire an image. When a front camera needs to be enabled, the first type subpixels 11 may not be displayed, that is, may be in a dark state, while the second type subpixels T may be transparent, that is, in a light-transmitting state, in which an optical path may be provided for the image acquisition component under the first region S1. In an example where the first pixel includes three first type subpixels and one second type subpixel, ¼ of a complete first pixel may be transparent, and for the entire first region S1, ¼ of an external image can be captured by the image acquisition component disposed under the electroluminescent display panel.

Figure 2:
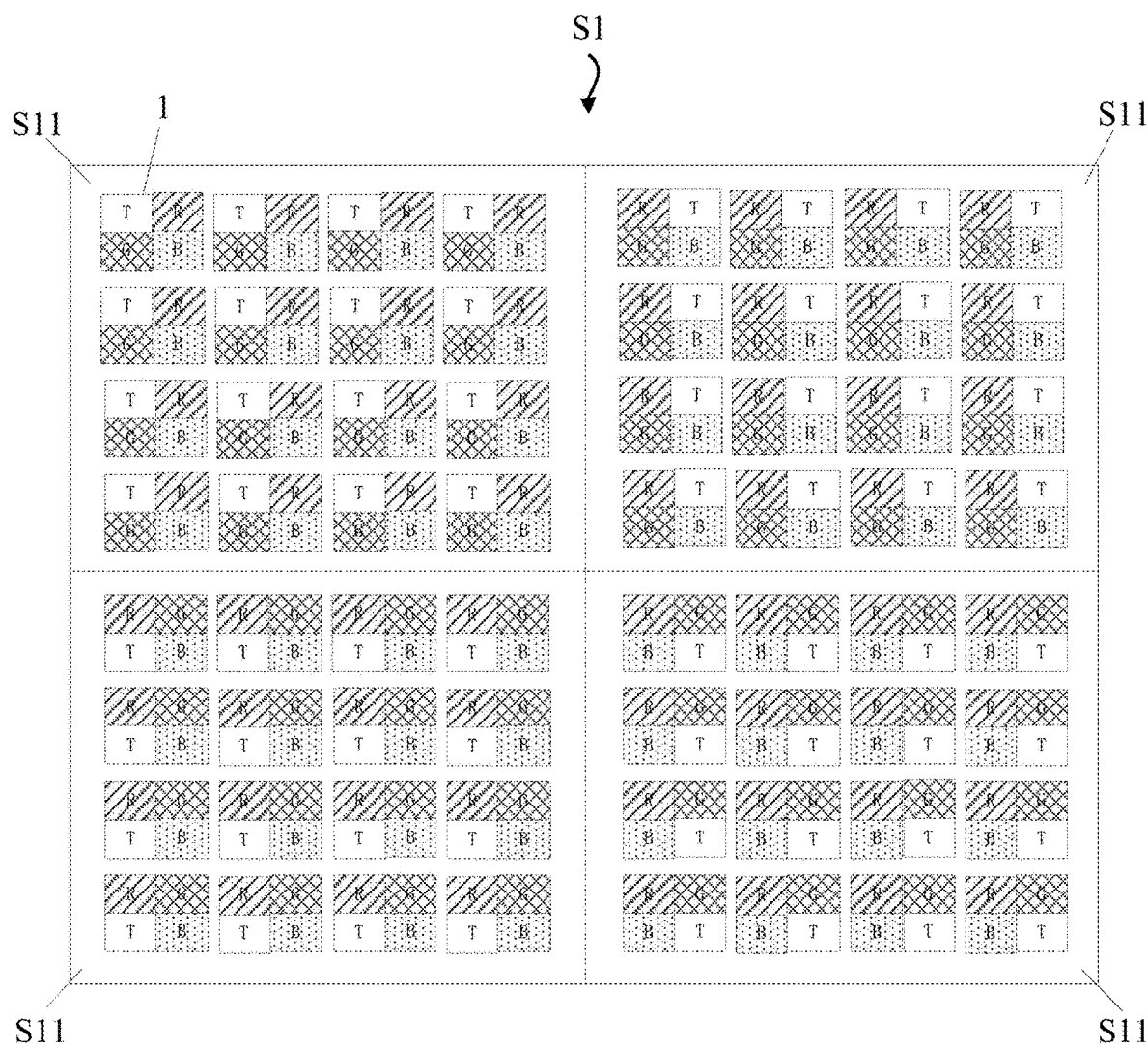
FIG. 2 is a schematic view of an enlarged structure of a first region according to at least one embodiment of the present disclosure.

In some example embodiments, the first region S1 may include a plurality of first sub-regions S11, arrangement positions of the second type subpixels T in the first pixels 1 in the same first sub-region S11 may be the same, and arrangement positions of the second type subpixels T in the first pixels 1 in different first sub-regions S11 may be different from each other. For example, as shown in FIG. 2, the first region S1 may include four first sub-regions S11, namely, an upper left first sub-region, an upper right first sub-region, a lower left first sub-region, and a lower right first sub-region. The second type subpixels T of the first pixels 1 in the upper left first sub-region may all be located at the upper left of the first pixels 1. The second type subpixels T of the first pixels 1 in the upper right first sub-region may all be located at the upper right of the first pixels 1. The second type subpixels T of the first pixels 1 in the lower left first sub-region may all be located at the lower left of the first pixels 1. The second type subpixels T of the first pixels 1 in the lower right first sub-region may all be located at the lower right of the first pixels 1. The positions of the second type subpixels T in the first pixels 1 in the upper left first sub-region, the upper right first sub-region, the lower left first sub-region, and the lower right first sub-region may be different from each other.

In this example embodiment, the arrangement positions of the second type subpixels T in the first pixels 1 in the same first sub-region S11 may all be the same, and the arrangement positions of the second type subpixels T in the first pixels 1 in different first sub-regions S11 may be different from each other, that is, light may pass through each of the first sub-regions S11 to obtain an image of a target shooting object at approximately the same position, and different first sub-regions S11 correspond to different positions of the target shooting object, so that a complete target image can be obtained by combining and synthesizing images of different positions of the target shooting object obtained by light passing through the different first sub-regions S11.

Figure 3:
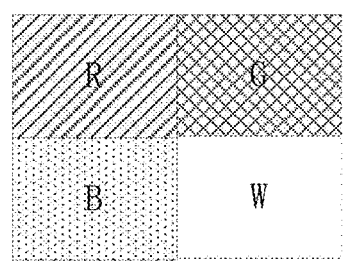
FIG. 3 is a schematic view of a distribution structure of second pixels according to at least one embodiment of the present disclosure.
Figure 4:
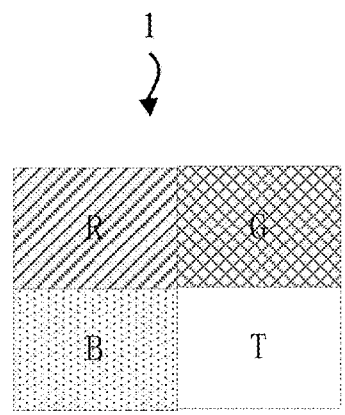
FIG. 4 is a schematic view of a distribution structure of first pixels according to at least one embodiment of the present disclosure.

In some example embodiments, the second pixel 2 may include four first type subpixels of different colors; and the first pixel 1 may include three first type subpixels 11 of different colors and one second type subpixel T. The subpixels in a first pixel 1 and in a second pixel 2 may have a "⊞"-shaped distribution. In some examples, referring to FIG. 3, the four first type subpixels of different colors included in the second pixel 2 may be a red subpixel R, a green subpixel G, a blue subpixel B, and a white subpixel W, respectively. Referring to FIG. 4, the three first type subpixels of different colors included in the first pixel 1 may be a red subpixel R, a green subpixel G, and a blue subpixel B, respectively. However, this is not limited in the present embodiment. In some examples, the subpixels in the first pixel and in the second pixel may be arranged in parallel in rows or columns.

In some examples, the subpixels in the first pixel and in the second pixel may be arranged in rounded rectangles. However, this is not limited in the present embodiment. For example, the subpixels in the first pixel and in the second pixel may be arranged in other shapes such as rhombus, triangle, etc.

In some examples, sizes and shapes of the plurality of subpixels in the first pixel may be the same or different. Sizes and shapes of the plurality of subpixels in the second pixel may be the same or different. Sizes of the subpixels in the first pixel may be the same as or different from the sizes of the subpixels in the second pixel, and the shapes of the subpixels in the first pixel may be the same as or different from the shapes of the subpixels in the second pixel. This is not limited in the present embodiment.

In some example embodiments, the division of the first region S1 (i.e., arrangement of the plurality of first sub-regions) may be the same as the arrangement of the subpixels in the first pixel 1. For example, as shown in FIG. 2, the first region S1 may include four first sub-regions S11, and the first sub-regions S11 are distributed in a "⊞" shape. The first pixel 1 may include four subpixels (i.e., a red subpixel R, a green subpixel G, a blue subpixel B, and a second type subpixel T), and the four subpixels are distributed in a "⊞" shape. Moreover, in each of the first sub-regions S11, the arrangement positions of the second type subpixels T in the first pixels 1 may be different. In this way, when the four first sub-regions S11 are respectively provided with corresponding sub-image acquisition units, light passing through each of the first sub-regions S11 can be acquired, and then a complete target image can be acquired.

Figure 5:
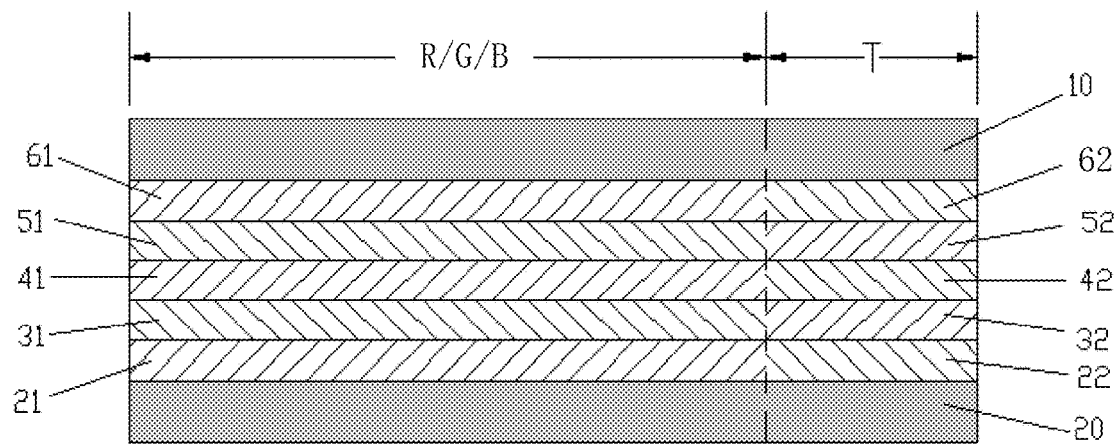
FIG. 5 is a schematic view of a sectional structure of an electroluminescent display panel according to at least one embodiment of the present disclosure.

In some example embodiments, referring to FIG. 5, the second type subpixel T may include a first electrode 22 and a second electrode 62 which are light-transmitting and are oppositely arranged, an ion conductive layer 32, an electrochromic layer 42, and an ion storage layer 52 which are sequentially stacked between the first electrode 22 and the second electrode 62. The first electrode 22 and the second electrode 62 may be made of transparent conductive materials. Illustratively, the electrochromic layer 42 may be made of an inorganic metal oxide, for example, tungsten trioxide ($WO_3$) or nickel oxide ($NiO_x$). In this example embodiment, the second type subpixel T includes the ion conductive layer 32, the electrochromic layer 42, and the ion storage layer 52 that are sequentially stacked, and can realize bistable performance under the action of a voltage, thereby enabling switching between light transmission and non-light transmission.

In some example embodiments, referring to FIG. 5, the electroluminescent display panel may further include: a first transparent substrate 20 located on a side of the first electrode 22 facing away from the second electrode 62, and a second transparent substrate 10 located on a side of the second electrode 62 facing away from the first electrode 22. As shown in FIG. 5, the first type subpixel (e.g., the red subpixel R, the green subpixel G, or the blue subpixel B) may include: a base layer 21, an anode layer 31, a conductive layer 41, an emission layer 51, and a cathode layer 61, which are disposed in this order between the first transparent substrate 20 and the second transparent substrate 10. The material of the emission layer 51 may vary depending on the color of the first type subpixel. In this example, the materials of the emission layers 51 of the red subpixel R, the green subpixel G, and the blue subpixel B are different. A driving circuit of the first type subpixel may be disposed on the base layer 21, and the driving circuit may be configured to provide a light emission driving signal to the anode layer 31 to enable the first type subpixel to emit light. The driving circuit may include a plurality of thin film transistors and storage capacitors, which is not limited in the present embodiment.

Figure 6:
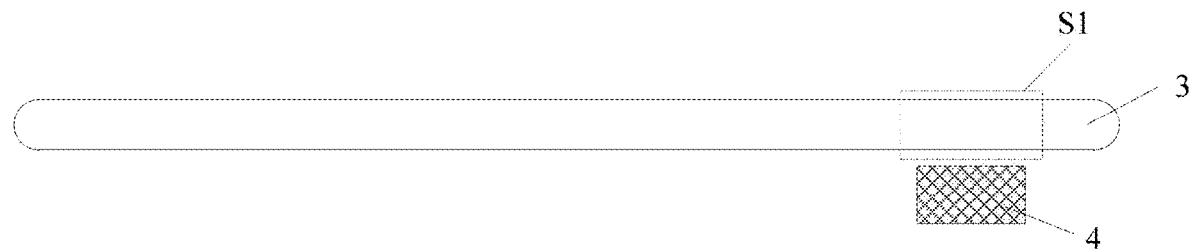
FIG. 6 is a schematic view of a structure of a display apparatus according to at least one embodiment of the present disclosure.

An embodiment of the present disclosure further provides a display apparatus, as shown in FIG. 6, which may include an electroluminescent display panel 3 and an image acquisition component 4 located at a back surface of the electroluminescent display panel 3. The electroluminescent display panel 3 may include a first region S1 and a second region. The first region S1 may include a plurality of first pixels, and each of the first pixels may include a plurality of first type subpixels and at least one second type subpixel. The second region may include a plurality of second pixels, and each of the second pixels may include a plurality of first type subpixels. The second type subpixel may be configured to be light-transmitting and non-light-transmitting in an image acquisition state and in an image display state, respectively. The image acquisition component 4 may be disposed corresponding to the first region S1. The image acquisition component 4 may be configured to acquire, during image acquisition, a plurality of images at different positions of the first region S1 and combine the plurality of images into a complete target image. As to the relevant description on the electroluminescent display panel, reference may be made to the description on the previous embodiment, which will not be repeated here.

As shown in FIG. 6, the image acquisition component 4 may be disposed directly under the first region S1. In some examples, an orthographic projection of the image acquisition component 4 on the electroluminescent display panel 3 may overlap with the first region S1.

In some example embodiments, the first pixel may include three first type subpixels of different colors and one second type subpixel. The second pixel may include four first type subpixels of different colors. The second type subpixel may include: a first electrode and a second electrode which are light-transmitting and are oppositely arranged, an ion conductive layer, an electrochromic layer, and an ion storage layer, which are sequentially stacked between the first electrode and the second electrode.

In some example embodiments, the first region S1 may include a plurality of first sub-regions, arrangement positions of second type subpixels within first pixels in the same first sub-region may all be the same, and arrangement positions of second type subpixels in first pixels in different first sub-regions may be different from each other. The image acquisition component 4 may include a plurality of sub-image acquisition units each provided corresponding to each of the first sub-regions S11. Each sub-image acquisition unit may be configured to acquire, during image acquisition, light passing through second type subpixels in a corresponding first sub-region S11. In this example embodiment, a complete target image can be acquired by the plurality of sub-image acquisition units. Referring to FIG. 2, the proportion of the second type subpixels T in each first pixel 1 may be ¼. Therefore, each sub-image acquisition unit can capture only ¼ of the original picture. Accordingly, the other three sub-image acquisition units are required to capture the other three ¼ of the original picture, respectively, and then the ¼ pictures captured respectively by the four sub-image acquisition units are processed and combined into one complete target image.

In this example embodiment, the second type subpixels T are arranged in other ways, which are also applicable to the first pixels. For example, the four subpixels of the first pixel 1 may be arranged in parallel in one row. Correspondingly, four first sub-regions S11 arranged in parallel in one row may be provided, and four sub-image acquisition units may be provided corresponding to the four first sub-regions S11. The number of sub-image acquisition units may depend on the proportions of the second type subpixels T in the entire first pixels.

Figure 7:
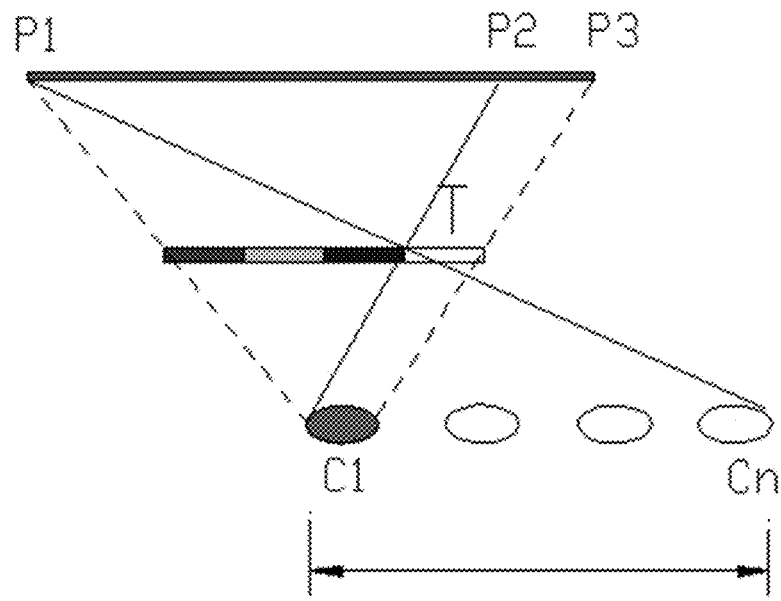
FIG. 7 is a schematic view of a moving process of an image acquisition component according to at least one embodiment of the present disclosure.

In some example embodiments, the image acquisition component may move within the first region S1 during image acquisition to acquire light passing through the second type subpixels at different positions of the first region S1. In some examples, when the first region S1 includes a plurality of first sub-regions S11, the image acquisition component may move within the plurality of first sub-regions S11 to acquire light passing through second type subpixels T of a corresponding first sub-region S11. In this example embodiment, only one image acquisition component (for example, a camera) is required to realize full-screen display and shooting, and there is no need to increase the number of image acquisition components, which will not increase the shooting cost. Since the second type subpixels T occupy only a part of the area in the first pixel 1, when the image acquisition component performs image acquisition, the second type subpixels T may be shielded by other first type subpixels 11 (e.g., the red subpixel R, the green subpixel G, and the blue subpixel B), as a result, the picture captured by the image acquisition component is only partial. In order not to increase the cost, in this example embodiment, the built-in image acquisition component can be moved to increase the capture range of the image acquisition component. Combined with FIG. 7, when no first pixel is provided by the display apparatus in an image acquisition area (i.e., the first region), the image acquisition component can capture the range of P1 to P3. In this example embodiment, when the image acquisition component is not moved, it can capture only the range of P2 to P3, and a range other than the range of P2 to P3 can be captured by moving the image acquisition component. In some examples, when the image acquisition component (e.g., a camera) receives a shooting instruction, the image acquisition component may polarize from C1 to Cn in the capture range of image optical imaging, and continuously capture a plurality of images during polarization, so that the image acquisition component can respectively acquire images shielded by the first type subpixels, and through system processing, the continuously captured images can be combined to finally obtain a complete picture in the range of P1 to P3.

In some example embodiments, the distance between the image acquisition component 4 disposed under the screen and the emission layer in the electroluminescent display panel 3 determines the range shielded by the first type subpixels 11, and the proportion t of the second type subpixels T in the entire pixels determines the number of continuously captured images. 1/t is rounded up to obtain the number of images captured. The plurality of images captured continuously can be combined to obtain a complete picture. In some examples, continuous shooting can be completed averagely within the time during which the image acquisition component 4 is polarized once.

Figure 8:
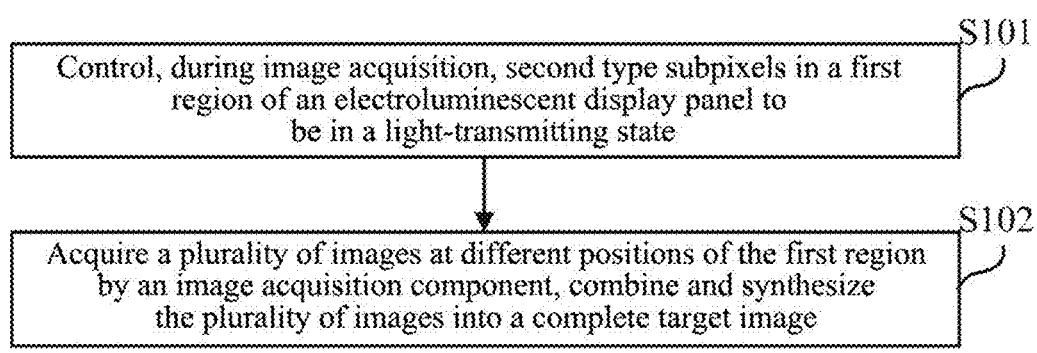
FIG. 8 is a schematic view of a process of an image acquisition method for a display apparatus according to at least one embodiment of the present disclosure.

Referring to FIG. 8, an embodiment of the present disclosure further provides an image acquisition method for a display apparatus. As to the display apparatus of this embodiment, reference may be made to the description of the above embodiment, which will not be repeated here. The image acquisition method for a display apparatus provided in this embodiment may include steps S101 to S102.

In step S101, controlling, during image acquisition, second type subpixels in a first region of an electroluminescent display panel to be in a light-transmitting state.

In step S102, acquiring, by an image acquisition component, a plurality of images at different positions of the first region, and combining the plurality of images into a complete target image.

In some example embodiments, the image acquisition component may include: a plurality of sub-image acquisition units provided corresponding to each of the first sub-regions respectively. The acquiring a plurality of images at different positions of the first region by the image acquisition component in step S102 may include: acquiring, by each sub-image acquisition unit, light passing through second type subpixels in a corresponding first sub-region.

In some example embodiments, in step S102, the acquiring a plurality of images at different positions of the first region by the image acquisition component may include: controlling the image acquisition component to move in the first region to acquire light passing through second type subpixels at different positions of a corresponding first region.

In some example embodiments, the image acquisition method according to this embodiment may further include: controlling, during image display, the second type subpixels in the first region of the electroluminescent display panel to be in a non-light-transmitting state.

In the electroluminescent display panel according to the embodiment of the present disclosure, the first region includes a plurality of first pixels, each first pixel including a plurality of first type subpixels and a second type subpixel that is configured to be light-transmitting and non-light-transmitting in an image acquisition state and in an image display state, respectively. Then an image acquisition component may be provided under the first region. When image acquisition is required, the second type subpixels in the first region are controlled to be in a light-transmitting state to provide the image acquisition component with an optical path, then the image acquisition component may perform image acquisition by light passing through the second type subpixels, and combine and synthesize images formed by the light passing through the second type subpixels at different positions of the first region to form a complete target image. When image display is required, the second type subpixels may be in a non-light-transmitting state and cooperate with other first type subpixels in the first region to realize color display in the first region, and can enable, in combination with the second pixels in the second region, the electroluminescent display panel to present full-screen display, thereby realizing switching between image acquisition and full-screen display.

Those skilled in the art may make one or more modifications and variations to the present disclosure without departing from the spirit and scope of the present disclosure. Thus, if these modifications and variations to the present disclosure fall within the scope of the claims of the present disclosure and their equivalent techniques, the present disclosure is intended to include these modifications and variations.

What we claim is:

1. A display apparatus, comprising: an electroluminescent display panel and an image acquisition component located on a back surface of the electroluminescent display panel;
    wherein the electroluminescent display panel comprising:
       a first region and a second region, the first region comprising a plurality of first pixels each comprising a plurality of first type subpixels and at least one second type subpixel; and the second region comprising a plurality of second pixels each comprising a plurality of first type subpixels, the second type subpixel being configured to be light-transmitting and non-light-transmitting in an image acquisition state and in an image display state, respectively,
    wherein the first region comprises a plurality of first sub-regions, arrangement positions of second type subpixels in first pixels in the same first sub-region are the same, and arrangement positions of second type subpixels in first pixels in different first sub-regions are different from each other;
    wherein the image acquisition component being disposed corresponding to the first region and configured to acquire, during image acquisition, a plurality of images at different positions of the first region, and combine the plurality of images into a complete target image, and
    wherein a portion of the second type subpixels is shielded by the first type subpixels during image acquisition.

2. The display apparatus according to claim 1, wherein the second type subpixel comprises: a first electrode and a second electrode which are light-transmitting and are oppositely arranged, and an ion conductive layer, an electrochromic layer, and an ion storage layer, which are sequentially stacked between the first electrode and the second electrode.

3. The display apparatus according to claim 2, wherein a first pixel comprises three first type subpixels of different colors and one second type subpixel; and a second pixel comprises four first type subpixels of different colors.

4. The display apparatus according to claim 3, wherein subpixels in the first pixel and the second pixel all have a "|||"-shaped distribution.

5. The display apparatus according to claim 1, wherein arrangement of the plurality of first sub-regions is the same as arrangement of subpixels in the first pixels.

6. The display apparatus according to claim 1, wherein the image acquisition component is configured to move, during image acquisition, in the first region to acquire light passing through second type subpixels at different positions of the first region.

7. An image acquisition method for a display apparatus, the display apparatus comprising: an electroluminescent display panel and an image acquisition component located on a back surface of the electroluminescent display panel; the electroluminescent display panel comprising: a first region and a second region, the first region comprising a plurality of first pixels each comprising a plurality of first type subpixels and at least one second type subpixel; and the second region comprising a plurality of second pixels each comprising a plurality of first type subpixels; the image acquisition component being disposed corresponding to the first region, wherein the first region comprises a plurality of first sub-regions, arrangement positions of second type subpixels in first pixels in the same first sub-region are the same, and arrangement positions of second type subpixels in first pixels in different first sub-regions are different from each other; and wherein a portion of the second type sub-pixels is shielded by the first type subpixels during image acquisition, the image acquisition method comprising:
controlling, during image acquisition, second type subpixels in the first region of the electroluminescent display panel to be in a light-transmitting state; and
acquiring a plurality of images at different positions of the first region by the image acquisition component, and combining the plurality of images into a complete target image.

8. The image acquisition method according to claim 7, wherein the acquiring a plurality of images at different positions of the first region by the image acquisition component comprises:

controlling the image acquisition component to move in the first region to acquire light passing through second type subpixels at different positions of a corresponding first region.

9. The image acquisition method according to claim 7, further comprising: controlling, during image display, the second type subpixels in the first region of the electroluminescent display panel to be in a non-light-transmitting state.

10. The image acquisition method according to claim 7, wherein the second type subpixel comprises: a first electrode and a second electrode which are light-transmitting and are oppositely arranged, and an ion conductive layer, an electrochromic layer, and an ion storage layer, which are sequentially stacked between the first electrode and the second electrode.

11. The image acquisition method according to claim 10, wherein a first pixel comprises three first type subpixels of different colors and one second type subpixel; and a second pixel comprises four first type subpixels of different colors.

12. The image acquisition method according to claim 11, wherein subpixels in the first pixel and the second pixel all have a "⊞"-shaped distribution.

* * * * *